(12) United States Patent
Bronikowski et al.

(10) Patent No.: US 7,700,157 B2
(45) Date of Patent: *Apr. 20, 2010

(54) METHOD OF PRODUCING REGULAR ARRAYS OF NANO-SCALE OBJECTS USING NANO-STRUCTURED BLOCK-COPOLYMERIC MATERIALS

(75) Inventors: Michael J. Bronikowski, Altadena, CA (US); Brian D. Hunt, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 773 days.

This patent is subject to a terminal disclaimer.

(21) Appl. No.: 11/508,514

(22) Filed: Aug. 22, 2006

(65) Prior Publication Data

US 2006/0286297 A1  Dec. 21, 2006

Related U.S. Application Data

(62) Division of application No. 10/356,299, filed on Jan. 30, 2003, now Pat. No. 7,115,305.

(60) Provisional application No. 60/353,290, filed on Feb. 1, 2002.

(51) Int. Cl.
C23C 16/26 (2006.01)
(52) U.S. Cl. .................. 427/249.1; 427/256; 427/270; 427/272; 427/282; 423/447.3; 423/445 R; 977/DIG. 1
(58) Field of Classification Search .............. 427/249.1, 427/256, 270, 272, 282; 977/DIG. 1; 423/447.1, 423/447.3, 445 B, 445 R
See application file for complete search history.

(56) References Cited

U.S. PATENT DOCUMENTS

| | | | |
|---|---|---|---|
| 3,955,015 A | 5/1976 | Ohtsuka et al. |
| 4,104,204 A | 8/1978 | Williams |
| 4,173,474 A | 11/1979 | Tanaka et al. |
| 4,173,475 A | 11/1979 | Chandross et al. |
| 4,260,725 A | 4/1981 | Keogh et al. |
| 4,330,383 A | 5/1982 | Ellis et al. |
| 4,575,373 A | 3/1986 | Johnson |
| 4,617,350 A | 10/1986 | Maeda et al. |
| 4,685,921 A | 8/1987 | Peyman |
| 4,787,903 A | 11/1988 | Grendahl |
| 4,790,847 A | 12/1988 | Woods |
| 4,816,031 A | 3/1989 | Pfoff |
| 4,846,172 A | 7/1989 | Berlin |
| 4,921,589 A | 5/1990 | Yates et al. |
| 4,942,112 A | 7/1990 | Monroe et al. |
| 5,066,301 A | 11/1991 | Wiley |
| 5,110,339 A | 5/1992 | Ciriello et al. |
| 5,141,678 A | 8/1992 | Blum |
| 5,171,266 A | 12/1992 | Wiley et al. |
| 5,173,381 A | 12/1992 | Natansohn et al. |
| 5,213,825 A | 5/1993 | Shimizu et al. |
| 5,258,024 A | 11/1993 | Chavel et al. |
| 5,288,293 A | 2/1994 | O'Donnell, Jr. |
| 5,296,305 A | 3/1994 | Baude et al. |
| 5,443,506 A | 8/1995 | Garabet |
| 5,470,662 A | 11/1995 | Weber et al. |
| 5,480,428 A | 1/1996 | Fedorov et al. |
| 5,529,861 A | 6/1996 | Redfield |
| 5,549,668 A | 8/1996 | O'Donnell, Jr. |
| 5,617,020 A | 4/1997 | Campbell et al. |
| 5,623,002 A | 4/1997 | Nomura et al. |
| 5,684,636 A | 11/1997 | Chow et al. |
| 5,702,846 A | 12/1997 | Sato et al. |
| 5,725,575 A | 3/1998 | O'Donnell, Jr. |
| 5,728,155 A | 3/1998 | Anello et al. |
| 5,728,156 A | 3/1998 | Gupta et al. |
| 5,744,267 A | 4/1998 | Meerholz et al. |
| 5,762,836 A | 6/1998 | Bos et al. |
| 5,807,906 A | 9/1998 | Bonvallot et al. |
| 5,837,115 A | 11/1998 | Austin et al. |
| 5,858,585 A | 1/1999 | Haarer et al. |
| 5,892,601 A | 4/1999 | Curtis et al. |

(Continued)

FOREIGN PATENT DOCUMENTS

DE  3605512 A1  8/1986

(Continued)

OTHER PUBLICATIONS

Kakizawa, Yoshinori, et al., "Block Copolymer Self-Assembly into Monodispersive Nanoparticles with Hybrid Core of Antisense DNA and Calcium Phosphate". Langmuir, vol. 18, No. 12, Jun. 11, 2002, pp. 4539-4543.*

(Continued)

*Primary Examiner*—Bret Chen
(74) *Attorney, Agent, or Firm*—Christie, Parker & Hale, LLP

(57) ABSTRACT

A method of forming a periodic array of nano-scale objects using a block copolymer, and nano-scale object arrays formed from the method are provided. The method for forming the arrays generally includes the steps of depositing a block copolymer of at least two blocks on a substrate to form an ordered meso-scale structured array of the polymer materials, forming catalytic metal dots based on the meso-scale structure, and growing nano-scale objects on the catalytic dots to form an ordered array of nano-scale objects.

41 Claims, 9 Drawing Sheets

U.S. PATENT DOCUMENTS

| | | | |
|---|---|---|---|
| 5,920,536 | A | 7/1999 | Campbell et al. |
| 5,943,145 | A | 8/1999 | Curtis et al. |
| 5,948,470 | A | 9/1999 | Harrison et al. |
| 5,964,802 | A | 10/1999 | Anello et al. |
| 5,984,962 | A | 11/1999 | Anello et al. |
| 5,995,251 | A | 11/1999 | Hesselink et al. |
| 5,998,096 | A | 12/1999 | Umemoto et al. |
| 6,046,290 | A | 4/2000 | Berneth et al. |
| 6,146,227 | A | 11/2000 | Mancevski |
| 6,154,432 | A | 11/2000 | Faruqi et al. |
| 6,232,706 | B1 | 5/2001 | Dai et al. |
| 6,261,469 | B1* | 7/2001 | Zakhidov et al. ............... 216/56 |
| 6,271,281 | B1 | 8/2001 | Liao et al. |
| 6,278,231 | B1 | 8/2001 | Iwasaki et al. |
| 6,632,872 | B1* | 10/2003 | Pellerite et al. ............. 524/502 |
| 6,893,705 | B2* | 5/2005 | Thomas et al. ............. 428/141 |
| 7,112,617 | B2* | 9/2006 | Kim et al. ..................... 522/83 |
| 7,115,305 | B2* | 10/2006 | Bronikowski et al. .... 427/249.1 |
| 2002/0167118 | A1* | 11/2002 | Billiet et al. ................ 264/432 |
| 2007/0134420 | A1* | 6/2007 | Koberstein et al. .......... 427/258 |
| 2008/0248216 | A1* | 10/2008 | Yeung et al. ................ 427/553 |

FOREIGN PATENT DOCUMENTS

| | | |
|---|---|---|
| DE | 101 10 468 A1 | 9/2002 |
| EP | 0472384 A2 | 2/1992 |
| EP | 0689067 A2 | 12/1995 |
| EP | 0689067 A3 | 4/1997 |
| JP | 60175009 | 9/1985 |
| JP | 61027501 | 2/1986 |
| JP | 01120740 | 5/1989 |
| JP | 05-096553 | 4/1993 |
| JP | 06-310976 | 11/1994 |
| JP | 07281426 | 10/1995 |
| JP | 08101499 | 4/1996 |
| JP | 08101502 | 4/1996 |
| JP | 08101503 | 4/1996 |
| WO | WO 93/21245 A1 | 10/1993 |
| WO | WO 95/17460 A1 | 6/1995 |
| WO | WO 98/05272 A1 | 2/1998 |
| WO | WO 98/27863 A1 | 7/1998 |
| WO | WO 99/26112 A1 | 5/1999 |
| WO | WO 00/41650 A1 | 7/2000 |
| WO | WO 01/21061 A1 | 3/2001 |
| WO | WO 01/71411 A2 | 9/2001 |
| WO | WO 01/86647 A2 | 11/2001 |

OTHER PUBLICATIONS

Gorzolnik, B., et al., "Nano-structured micropatterns by combination of block copolymer self-assembly and UV photolithography". Nanotechnology 17 (2006), pp. 5027-5032.*

Malenfant, Patrick R., et al., "Self-assembly of an organic-inorganic block copolymer for nano-ordered ceramics". Nature Nanotechnology vol. 2 Jan. 2007 pp. 43-46.*

Baughman et al., "Carbon Nanotube Actuators," Science, May 21, 1999, vol. 284, pp. 1340-1344.

Hafner et al., "Catalytic Growth of Single-Wall Carbon Nanotubes From Metal Particles," Chemical Physics Letters, Oct. 30, 1998, vol. 296, pp. 195-202.

Harrison et al., "Lithography With a Mask of Block Copolymer Microstructures," J. Vac. Sci. Technol. B, vol. 16, No. 2, Mar./Apr. 1998, pp. 544-552.

Hoppe et al., "Arrays of Carbon Nanotubes as RF Filters in Waveguides," May 9, 2003; website http://www.nasatech.com/Briefs/Apr03/NPO30207.html, pp. 1-2.

Li et al., "Highly-Ordered Carbon Nanotube Arrays for Electronics Applications," Applied Physics Letters, Jul. 19, 1999, vol. 75, No. 3, American Institute of Physics, pp. 367-369.

Ren et al., "Synthesis of Large Arrays of Well-Aligned Carbon Nanotubes on Glass," Science, vol. 282, Nov. 6, 1998, pp. 1105-1107.

Spatz et al., "Ordered Deposition of Inorganic Clusters From Micellar Block Copolymer Films," Langmuir, 2000, vol. 16, American Chemical Society, pp. 407-415.

Thurn-Albrecht et al., "Ultrahigh-Density Nanowire Arrays Grown in Self-Assembled Diblock Copolymer Templates," Science, Dec. 15, 2000, vol. 290, pp. 2126-2129.

Yang et al., "Generalized Syntheses of Large-Pore Mesoporous Metal Oxides With Semicrystalline Frameworks," Nature, Nov. 12, 1998, vol. 396, Macmillan Publishers Ltd., pp. 152-155.

* cited by examiner

Step 1

Step 2

Step 3

Step 4

Step 5

METHOD OF PRODUCING REGULAR ARRAYS OF NANO-SCALE OBJECTS USING NANO-STRUCTURED BLOCK-COPOLYMERIC MATERIALS

CROSS-REFERENCE TO RELATED APPLICATION

This application is a divisional application of U.S. patent application Ser. No. 10/356,299 filed Jan. 30, 2003, now U.S. Pat. No. 7,115,305, issued Oct. 3, 2006, which is based on U.S. application Ser. No. 60/353,290, filed Feb. 1, 2002, the disclosure of which is incorporated by reference.

STATEMENT REGARDING FEDERALLY SPONSORED RESEARCH

The U.S. Government has certain rights in this invention pursuant to grant No. NAS 101187-2.1, awarded by the National Aeronautics and Space Administration, Office of Space Science.

FIELD OF THE INVENTION

The present invention is directed to a method of producing regular arrays of carbon nanotubes, and more particularly to methods of producing regular arrays of carbon nanotubes using self-assembling block-copolymeric materials.

BACKGROUND OF THE INVENTION

Carbon nanotubes (CNT) have potential uses in a wide array of applications. In particular, regularly spaced arrays of CNTs are expected to have wide ranging applications, either as new and novel devices or as substantial improvements over existing technology. Carbon nanotubes are electrically conductive, have high strength and stiffness, and exhibit electromechanical coupling similar to piezo-electric materials: mechanical deformations of a CNT can induce charge transfer into the nanotube, and injected charge can produce deformation or mechanical stress in the nanotube.

These properties combine to give CNTs their versatility in a wide range of uses. One example uses an array of nanotubes as a filter medium in electrophoretic separations of biomolecules. Electrophoretic separation occurs through the differential transport of polyelectrolytes (DNA, proteins, etc.) through a porous medium in the presence of an electric field. The medium acts as a sieve, producing a size-dependent mobility of the molecules. Current state-of-the-art biomolecular analytical systems use polymer gels as sieves. Such gels typically have a wide, random distribution of pore sizes, often extending into size ranges much greater than that of the molecules of interest (1-10 nm), which limits the efficiency of such gels in separations. In addition, polymer gels are susceptible to radiation damage and thermal decomposition, limiting their utility in analysis in harsh environments of interest to NASA. A regularly-spaced array of carbon nanotubes, with well-defined diameters and tube-tube separations in the range of 1-10 nm, is expected to be much more efficient at such separations, much more amenable to miniaturization, and much more tolerant of harsh environments owing to the high stability of CNT. Arrays of CNT would thus advance this technology and make these methods useful in many new environments.

Another set of applications for CNT arrays takes advantage of their mechanical and electrical properties. The high strength and stiffness of these structures makes free-standing CNT excellent candidates for high-Q, high-frequency, nanoscale oscillators. In addition, the electromechanical coupling provides a means by which to either excite vibrations (by applying an RF signal), or to monitor the motions/vibrations of nanotubes by monitoring the current induced as they mechanically oscillate. Arrays of CNT have thus been proposed for use as nanometer-scale RF filters, RF signal detectors and analyzers, and spectrum analyzers for mechanical vibrations (the "electronic ear"). In addition, nanotubes can be functionalized with various chemical substituents to make various molecules bind to them more or less strongly. A nanotube so functionalized would be expected to change its resonant frequency upon the attachment of a target molecule, so that arrays of functionalized nanotubes could also be used as nano-scale chemical sensors (the "electronic nose").

Finally, the small size and high aspect ratio of CNTs suggests that they will give off electrons by field emission at much lower voltages than the (much larger) metal field emitter tips currently in use. A regular array of independently-addressable nanotubes could thus be used as a low-voltage, low-power array of field emitters, for field emitter displays.

However, all of these applications rely on the ability to produce arrays of nanotubes with regular, well-defined intertube spacings. The nanotubes would also need to have their aspect ratios (diameter and wall-thickness vs. length) carefully controlled, to ensure that they stood upright on the substrate, rather than bending over. Many previous studies have reported mats of CNT catalytically grown on smooth substrates. These nanotubes are produced by the decomposition of carbon-containing gases (e.g., $C_2H_4$, CO) over nanometer-sized particles of catalytic metals (e.g., Fe, Ni). The nanotubes nucleate upon the metal particles and grow longer as carbon is produced by decomposition of the source gases upon the catalyst. In such studies, catalyst particles are produced by deposition of catalytic metals onto the substrate, either physically or chemically, so that the resultant particles are randomly distributed on the surface and have a wide distribution of sizes. Since the size of growing nanotubes is determined by the size of the catalyst particle from which it nucleates, this process results in growth of nanotubes with a wide diameter distribution, positioned at random upon the substrate surface.

To date, most demonstrations of nanotube growth from such supported catalysts have yielded densely-packed "fields" of nanotubes: neighboring nanotubes are typically in contact with one another, and the size distribution is wide and not well controlled. Clearly, such an "array" does not have the properties needed for the applications discussed above: nanotubes in contact cannot move or be addressed independently, and a wide range of diameters implies a wide range of resonant frequencies, making spectral analysis as described above impossible.

"Bulk" methods for depositing catalytic metals, such as physical or chemical vapor deposition, will result in a stochastic distribution of catalytic particle sizes and locations and thus is not suitable for generating ordered arrays. Lithographic methods, such as photolithography or electron-beam lithography, could work in principle, however photolithography does not have the resolution to make nanometer-sized particles, while conventional e-beam lithography will in general be too slow for large-scale throughput and production of devices using these CNT arrays.

However, recently a technique has been developed for producing geometrically regular self-assembled nanotube arrays with excellent uniformity. This process is based upon the self-organizing formation of highly uniform pore arrays in anodized aluminum films. First, a nanochannel alumina structure is formed by anodizing an aluminum film under conditions that lead to hexagonally-ordered arrays of narrow channels with very high aspect ratios. The nanochannel alumina structure is then used as a template for the growth of nanotube arrays of carbon and other materials, including metals and some semiconductors. The full process technique is disclosed in *Appl. Phys. Lett.*, Vol. 75, pg 367 (1999), and is incorporated herein by reference. Utilizing this technique the authors were able to grow nanotube arrays comprising uniform carbon nanotubes with a diameter of 32 nm. Despite the promise of this new technique, it is a complex procedure, and can provide arrays of CNT with only a narrow range of diameters, limiting its usefulness in some applications.

Accordingly, a need exists for improved method of producing, from catalytic metal particles supported on substrates, an array of nanotubes that are regularly spaced (in particular, they must not be in contact), and which have the same diameter and length (or at least have a very narrow distribution of sizes) in order that they have nearly identical electrical and mechanical properties.

SUMMARY OF THE INVENTION

The present invention is directed to a method for producing a uniform array of nano-scale objects utilizing self-assembling block copolymer molecules.

In one particular embodiment, the invention utilizes particular block copolymers to form ordered meso-scale structures, which can then be used to coordinate the formation of regular arrays of nanometer-sized dots of catalytic materials which can serve as nucleation points from which carbon nanotubes can be grown. In such an embodiment, the size and separation of the dots of catalytic material will depend on the size of the polymer blocks.

In still another embodiment, the catalytic dots have dimensions of a few tens of nanometers.

In yet another embodiment, the solution of block copolymer includes catalytic metal compounds designed to associate preferentially with one of the blocks of the block copolymer such that upon formation of the block copolymer meso-scale structure, the catalytic metal compounds form a regular array of regions with high metal content, that can then be used to grow the carbon nanotubes.

In still yet another embodiment, the mixture is spin coated onto a substrate.

In still yet another embodiment, the carbon nanotubes are formed from the decomposition of carbon-containing gases, such as methane, ethylene, acetylene or carbon monoxide.

In still yet another embodiment, the block copolymer meso-scale structure is removed by oxidation to leave only the regular array of dots of catalytic material.

In still yet another embodiment, a mixture of amphiphilic block copolymers and metal compounds having an appropriate associated polarity and/or philicity are utilized. In one such embodiment, the block copolymer monomers used are polystyrene and polymethylmethacrylate, the metal compound is iron chloride, and the substrate is silicon.

In still yet another embodiment, the method of producing the carbon nanotubes involves selectively removing the nanometer-scale structures made from one of the at least two different blocks from the substrate to create a plurality of voids in the polymeric array prior to the application of the catalytic material such that the catalytic material bonds within the voids to form the catalytic material array. In such an embodiment, the step of selectively removing may involve a removal method selected from the group consisting of a UV induced decomposition, reactive ion etching, acid-base reaction, and oxidation.

In still yet another embodiment, the method of producing the carbon nanotubes includes the step of etching an ordered orientation guide recess array into the substrate, from which the orientation of the carbon nanotubes may be controlled. In such a method, the step of etching may involve at least one process selected from the group consisting of metal etching, reactive ion etching, and $SiO_2$ etching.

In still yet another embodiment, the invention is directed to a self-assembled nano-array formed according to the block copolymer method described above. In such an embodiment the nano-array may be utilized as filter media in electrophoretic separations, as high-Q high-frequency nano-scale oscillators, nano-meter scale RF filters, RF signal detectors, analyzers, and field emitter tips.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION OF THE INVENTION

The present invention is directed to a method of forming a periodic array of nano-scale objects, such as carbon nanotubes from self-assembling block copolymeric materials.

Figure 1:
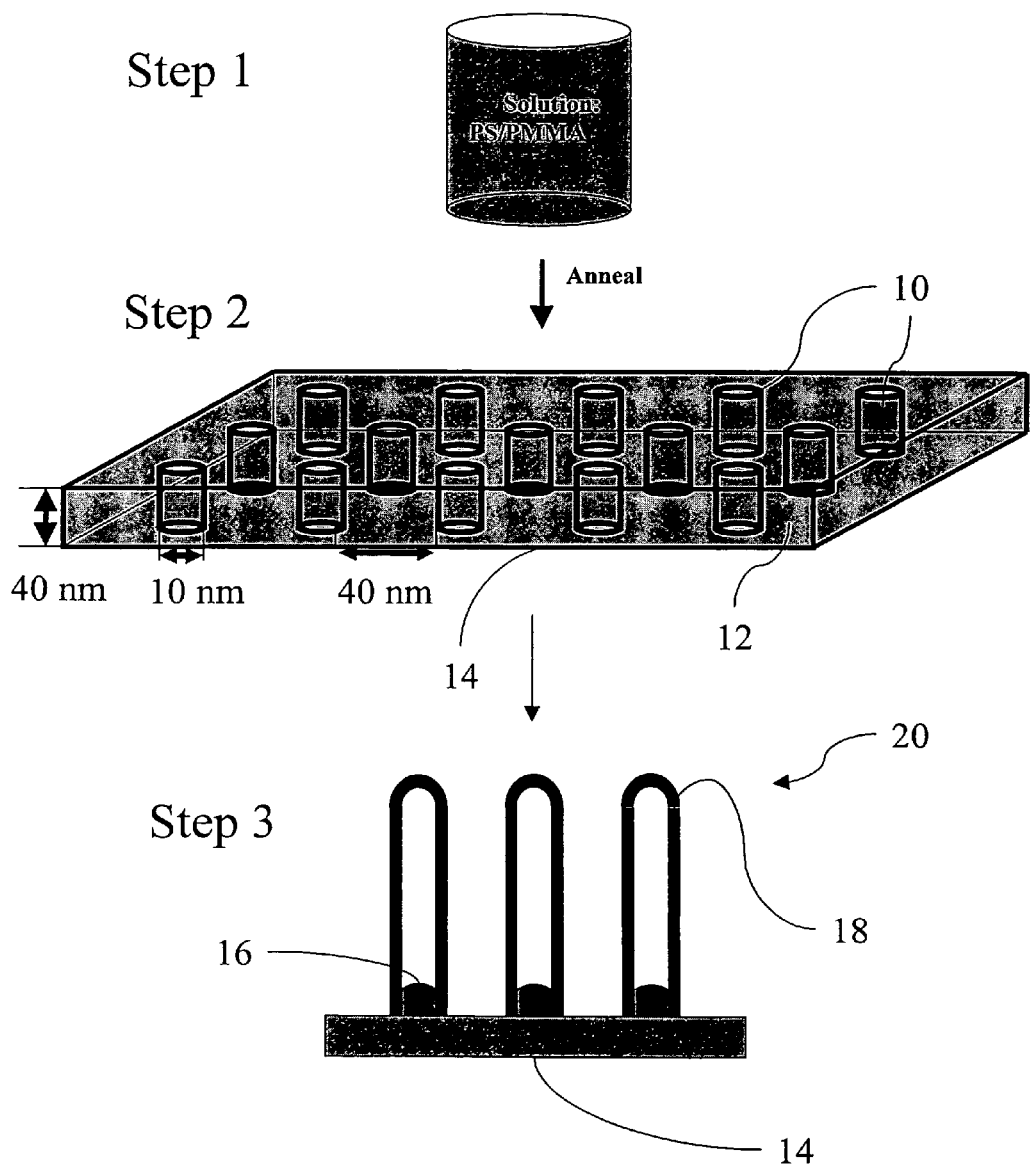
FIG. 1 is a schematic view of an embodiment of a generic process for forming a nanotube array according to the invention.

A generic embodiment of the process for forming ordered carbon nanotube arrays according to the current invention is shown schematically in FIG. 1. Although the materials used and the exact steps may vary, as shown, there are three general steps in the method for forming nano-arrays according to the present invention: 1) depositing the block copolymeric material 10 and 12 on a substrate 14 to form an ordered meso-scale structure array of the polymer materials; 2) formation of the catalytic metal dots 16 based on the meso-scale structure; and 3) growth of the carbon nanotubes 18 on the catalytic dots to form an ordered array 20 of carbon nanotubes.

The proposed method makes use of the fact that a certain class of molecules, called. block copolymers, can spontaneously self-assemble into regular arrays of nanometer-scale structures with periodically varying chemical properties.

Block copolymers are polymeric molecules consisting of two or more sections, or "blocks," each of which consists of a controlled number of monomers of a given type linked together as in a normal polymer molecule. Specifically, certain combinations of block copolymer molecules will, under appropriate conditions, self-assemble into larger, "meso-scale" structures having characteristic dimensions of about 5 to about 100 nanometers. Accordingly, such a polymeric material spontaneously acquires regular structure on a length scale substantially larger than the individual monomer units yet still much smaller than a macroscopic scale.

Using the different polymer blocks of such nanometer-structured materials as local binding agents, it is possible to arrange regular arrays of nanometer-sized dots of catalytic metals from which to grow arrays of carbon nanotubes. For example, using the differential binding properties (such as that arising from the differing polarities) of the polymer blocks with respect to various metal-containing catalytic precursor compounds one can selectively place clusters of catalytic metals in a regular, ordered array.

As briefly discussed above, the present invention relies on the nanoscale separation of BCP materials to form a nanoscale array. Nanoscale phase separation in BCP materials occurs because of the differing affinities, or binding properties, of the various blocks. This separation is driven by the same forces that drive macro-scale phase separations, such as the separation that occurs between oil and water. For example, blocks composed of monomers with polar (hydrophilic) chemical groups will "prefer", or have an affinity, to be in contact with each other because their energy is lowest in this arrangement because of their dipole interactions. Likewise, blocks composed of non-polar (hydrophobic) monomers will tend to associate with each other because the total energy of the system is lowest in this configuration.

For example, a block copolymer comprising polystyrene (PS) and polymethylmethacrylate (PMMA) blocks of appropriate lengths will, upon heating, undergo a nano-scale phase separation and arrange itself into an arrayed structure consisting of nano-regions of PMMA separated from each other in a matrix of PS. In this system, the separation occurs because the PMMA monomers tend to have large dipole moments arising from the highly polarized oxygen-atom-containing chemical groups present in these monomers. Likewise, the PS monomers are composed only of hydrogen and carbon atoms and so have only very small dipoles.

Figure 2:
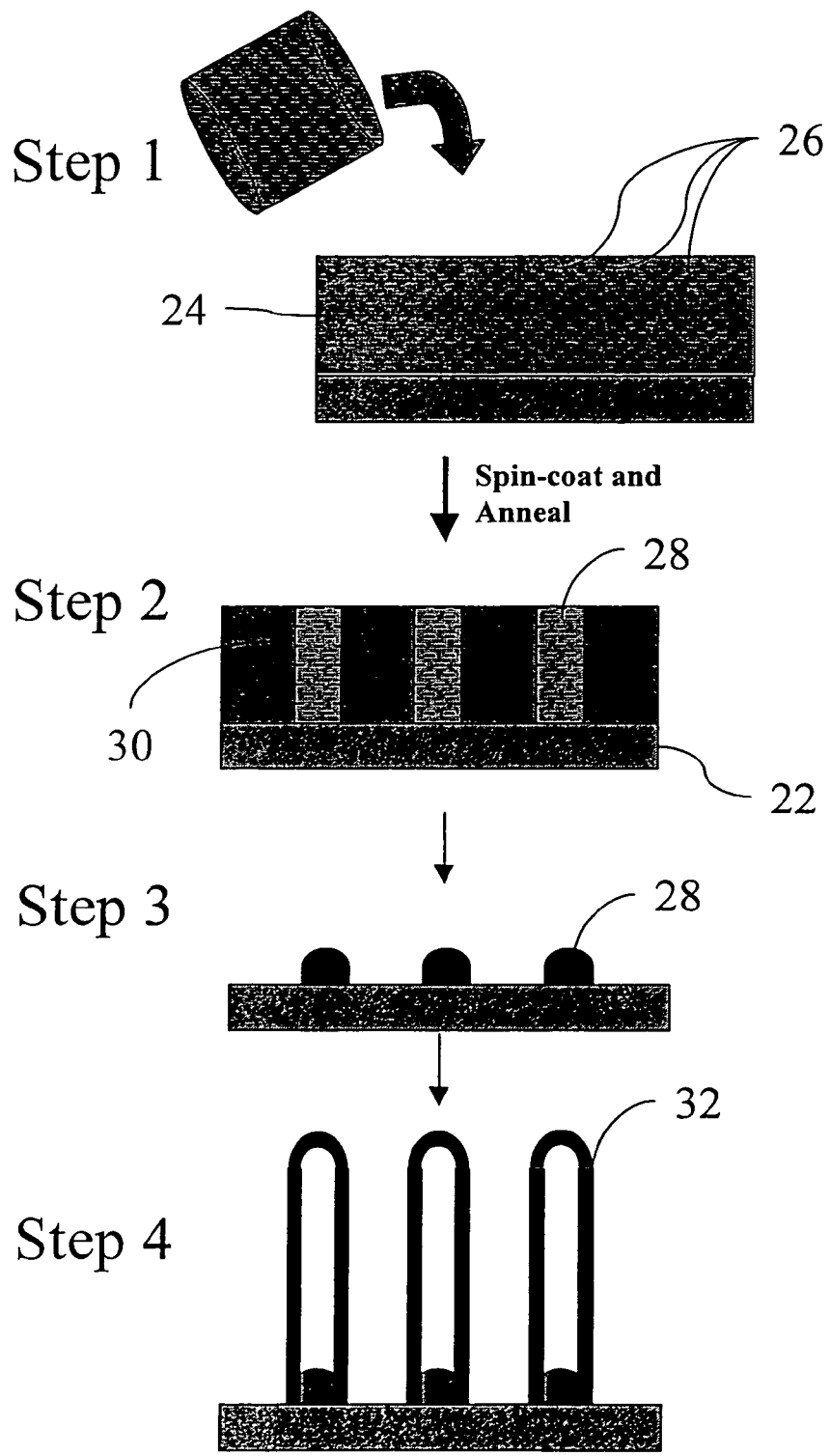
FIG. 2 is a schematic view of a first embodiment of a process for forming a nanotube array according to the invention.

A first exemplary embodiment of a process for forming the nano-array 20 of the present invention comprising nanotube nano-features utilizing a block copolymer (BCP) technique is shown schematically in FIG. 2. In a first step, a substrate 22, such as, for example, silicon is spin-coated with a mixture of block copolymer molecules 24 and a metal-containing catalytic precursor compound 26. Although any such block copolymer capable of self-assembling into larger order array meso-scale structures may be used, in the embodiment shown in FIG. 2, a block copolymer having blocks of polystyrene (PS) and polymethylmethacrylate (PMMA) is utilized. Likewise, although any suitable metal-containing compound having differential binding affinities for the polymer monomers may be used, in the embodiment shown in FIG. 2, $FeCl_3$ is utilized.

For example, a BCP formed of blocks of both PMMA and PS will have both polar and non-polar chemical groups. Such molecules are said to be "amphiphilic" because they can interact with other molecules of either philicity. Such differences in affinity within BCP molecules are exploited in the current invention to dose selected regions of the BCP with other molecules. Specifically, if ionic or strongly polar metal molecules are mixed with an amphiphilic BCP molecule in solution, these molecules will tend to associate with and bind preferentially with the polar regions of the resulting BCP material when the solvent is removed, because as discussed above the total energy of the system is minimized if charges or dipoles are near each other and can interact strongly. Likewise, if non-polar molecules are co-dissolved with BCP compounds, these molecules will tend to bind to the non-polar areas of the resulting BCP material.

In a second step, the spin-coated mixture is then annealed such that the monomers self-assembled into a well-ordered array structure having regions of high metal content 28 and zero metal content 30.

In step 3, the BCP matrix is removed, such as by an oxidation process such that only an array of high metal 28 and zero metal content 30 regions remain. In such an embodiment the size and shape of the regions will depend on the size of the associated binding sites of the BCP material.

In step 4, this regular array of metal dots 28 are then used to produce a regular array of carbon nanotubes 32. Specifically, the substrate with the array of metal regions is inserted into a furnace or vacuum system through which is flowed an appropriate carbon-containing gas at elevated temperature, such as, for example, methane, ethylene, acetylene, or carbon monoxide gas mixed in argon, nitrogen and/or ammonia at a temperature between about 600 and 900° C. The metal regions serve as nucleation points from which the carbon gases nucleate and grow carbon nanotubes 32. Because the size, shape, orientation, and spacing of the nucleation points may be controlled through the size and number of BCP monomers used, the size, shape, orientation, and spacing of the carbon nanotubes can also be controlled.

A specific example of this process can be described with relation to a mixture of a BCP composed of blocks of PS and PMMA, and $FeCl_3$. In this example, an amphiphilic BCP (PS/PMMA) is mixed with an ionic metal salt ($FeCl_3$) in an amphiphilic solvent, such as, for example, acetone. This solution is spin-coated onto a substrate, and then heated so that the BCP form pillars of PMMA in a PS matrix. Under such conditions, the $Fe^{3+}$ ions (and $Cl^-$ ions) would migrate to the PMMA regions during heating because the abundance of local dipoles in these regions (arising from the oxygen-bearing moieties) tend to attract and bind ionic species. As a result, a regular array of iron-rich and iron free regions with nanometer dimension are formed, which when the polymer is oxidized away, such as by heating to 400° C. in air, leaves an array of Fe particles from which a regular array of carbon nanotubes may be grown.

Figure 3:
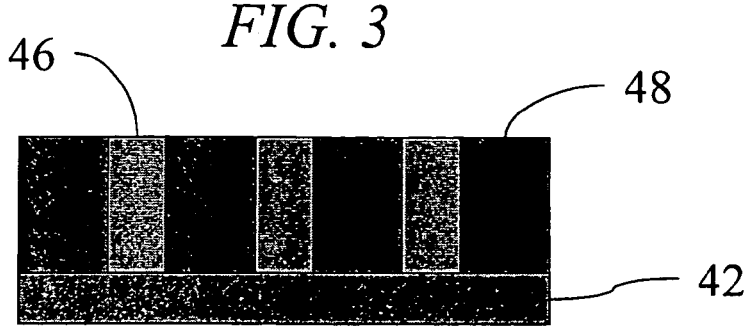
FIG. 3 is a schematic view of a second embodiment of a process for forming a nanotube array according to the invention.
Figure 3:
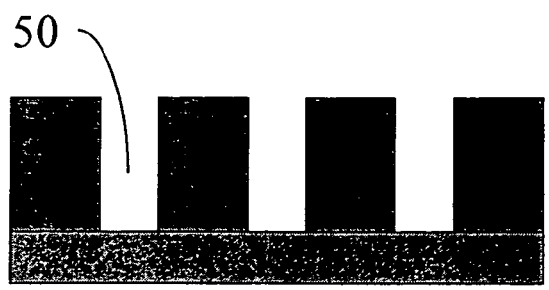
Figure 3:
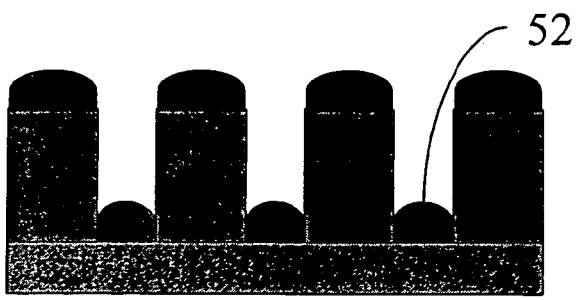
Figure 3:
Figure 3:
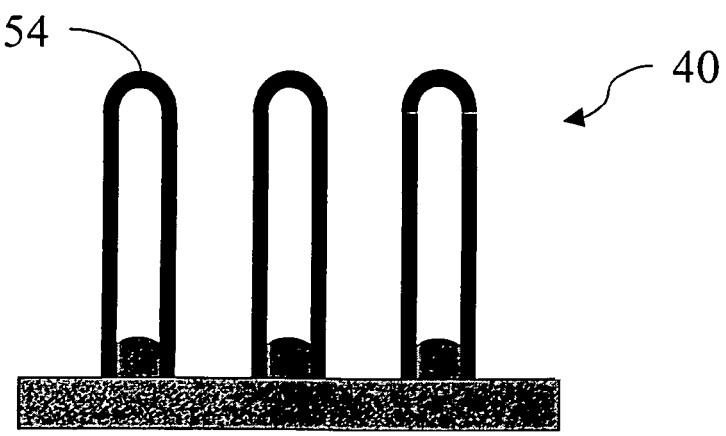

A second exemplary process for forming the nano-array 40 of the present invention comprising nanotube nano-features utilizing a block copolymer (BCP) technique is shown schematically in FIG. 3. In a first step, a substrate 42, such as, for example, silicon is coated with a block copolymer only. Although any block copolymer capable of self-assembling into a meso-scale structured array may be used, in the embodiment shown in FIG. 2, a BCP consisting of polystyrene (PS) and polymethylmethacrylate (PMMA) is utilized.

The spin-coated polymer layer is then annealed such that the BCP molecules undergo nanoscale phase separation and arrange into an arrayed structure consisting of cylinders 46 of one monomer separated from each other in a matrix 48 of the second monomer. Using the exemplary materials, annealing would, for example, produce cylinders of PMMA surrounded by a matrix of PS. As in the first exemplary process, the size and separation of the PMMA cylinders would depend on the size of the PS and PMMA blocks in the molecules.

In step 2, the block cylinders 46 are removed, such as by an oxidation process. For example, in a PMMA/PS system, this would be done by first exposing the thin film to UV light or high energy electrons, which degrades the PMMA, then washing in acetic acid to remove the degraded PMMA. Although only UV induced process is described above, any synthetic method that takes advantage of this type of differential reactivity between polymer blocks could in principle be used to fabricate nano-scale arrays from block copolymer materials. Additional examples of such potential "differential chemistry" include differential reactivity with respect to reactive ion etching (RIE), acid-base chemistry, and oxidation. Any such scheme could be exploited to preferentially remove one polymer and leave the other present as a template for nano-scale metal deposition. In such an embodiment the size and shape of the regions will depend on the size of the associated binding sites of the BCP material.

As shown in step 3, this process leaves a thin film of polystyrene 48 containing a regular array of holes 50, such that when metals 52 are deposited either electrochemically or by vapor deposition onto the surface of the substrate some of the metal is deposited onto the surface of the remaining polymer and some of the metal is deposited into the holes. As in the above embodiment, any suitable metal may be used, such as Co, Ni, Mo, W, Fe, Pd, other transition metals, and alloys thereof. For example, in the embodiment shown in FIG. 3, Fe is utilized.

In step 4, the polystyrene matrix 48 is removed (e.g., by salvation) leaving an array of metal dots 52 upon the substrate 42.

In step 5, as in the first exemplary process, this regular array of metal dots 52 are then used to produce a regular array of carbon nanotubes 54. Specifically, the substrate with the array of metal regions is inserted into a furnace or vacuum system through which is flowed an appropriate carbon-containing gas at elevated temperature, such as, for example, acetylene gas diluted in nitrogen and/or ammonia at about 650° C. The metal regions serve as nucleation points from which the carbon gases nucleate and grow carbon nanotubes 32. Because the size, shape, orientation, and spacing of the nucleation points may be controlled through the size and number of BCP monomers used, the size, shape, orientation, and spacing of the carbon nanotubes can also be controlled.

One example of such technology uses a block copolymer denoted P(S-b-MMA) consisting of a length, or "block," of polystyrene, typically 100 to 1000 styrene monomers in length, attached to a block of PMMA, typically 50-200 methylmethacrylate monomers long. Using a system comprising P(S-b-MMA) composed of a PS block approximately 300 monomers long connected to a PMMA block about 100 monomers long, produced self-assembled arrays of 14-nm diameter PMMA cylinders hexagonally packed in a PS matrix with a lattice constant of 24 nm.

Specifically, in one embodiment toluene solutions of this P(S-b-MMA) are spin-cast onto substrates, forming films ~1 micron thick. The nano-structured array spontaneously assemble when the sample is heated to 165° C. (well above the glass transition temperature) for 14 hours in an electric field of 40 V/Cm. Exposure to deep UV light followed by acetic acid rinse will remove the PMMA cylinders and leave a nanoporous PS film with 14 nm pores. These pores are then filled with cobalt metal by electrodeposition, yielding an array of cobalt "nanowires." The remaining polystyrene matrix is then removed using one of many available techniques including chemical treatment, solvation, oxidation, or RIE. Again, although this scheme utilizes the differential reactivity of the PS and PMMA blocks with respect to UV light/chemical treatment to transfer the nanoscale pattern within the polymer matrix to an underlying substrate, in principle, any block copolymer that forms nano-domains in this way can act as such a template, if the various blocks exhibit differential reactivity under some conditions which can be used to remove one block without affecting the other. For example, differential reactivity with respect to Reactive Ion Etching (RIE) has been used to transfer the nano-structured pattern in a polystyrene/polybutadiene (PS/PB) block copolymer matrix onto a silicon nitride substrate. PS/PB block copolymer forms nano-domains in a manner similar to the P(S-b-MMA) described above, and PB is etched much more rapidly than PS in a $CF_4$ plasma. Thus, on a substrate coated with PS/PB and processed with $CF_4$ RIE, areas under PB nanostructures can be exposed while those under the surrounding PS matrix remained covered.

Removal of the PS leaves behind a regular array of metal dots with diameters determined by the pore size and heights determined by either film thickness or total flux of incident metal during deposition. Such metal particles are known to nucleate and grow nanotubes under appropriate conditions. Specifically, the substrates with metal dot arrays can be inserted into a furnace or vacuum system, through which is flowed carbon-containing gas molecules, such as $C_2H_4$ or CO. Upon heating to appropriate temperatures (600-900° C.), the carbon-containing precursor gas molecules will decompose on the catalytic metal surfaces with minimal decomposition on other, non-catalytic regions of the substrate. The carbon generated at each metal particle will arrange into concentric graphitic layers and form a hollow tube, which grows away from the catalyst particle as more carbon is generated by incoming gas molecules.

Figure 4A:
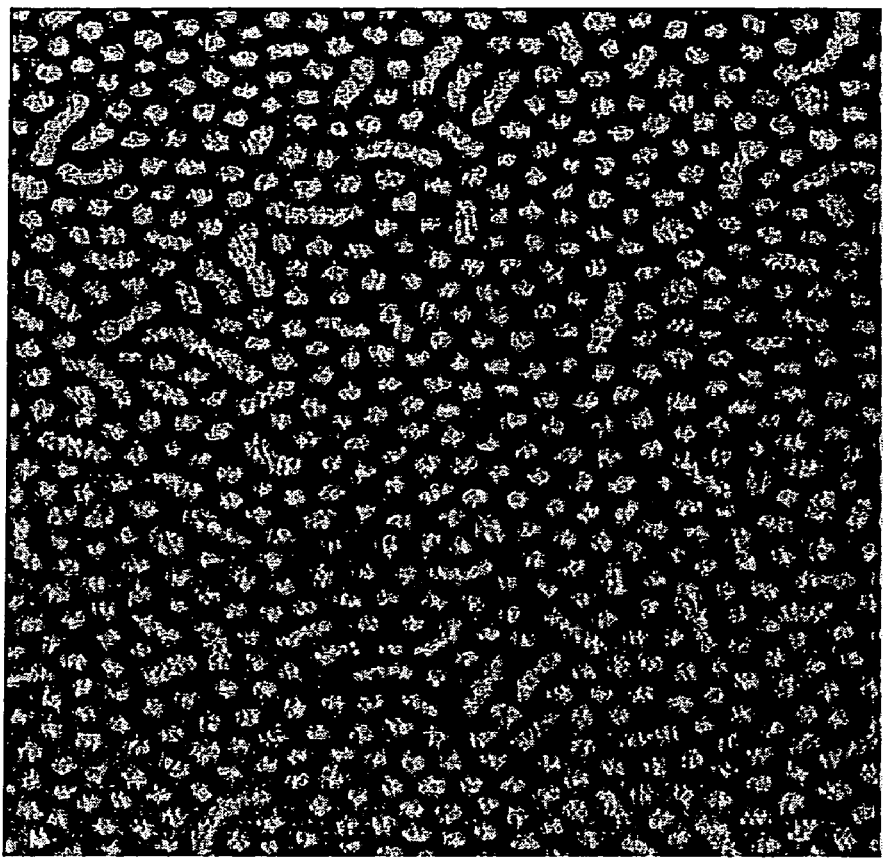
FIG. 4*a* is an AFM image of an embodiment of a step of the process according to the invention.
Figure 4B:
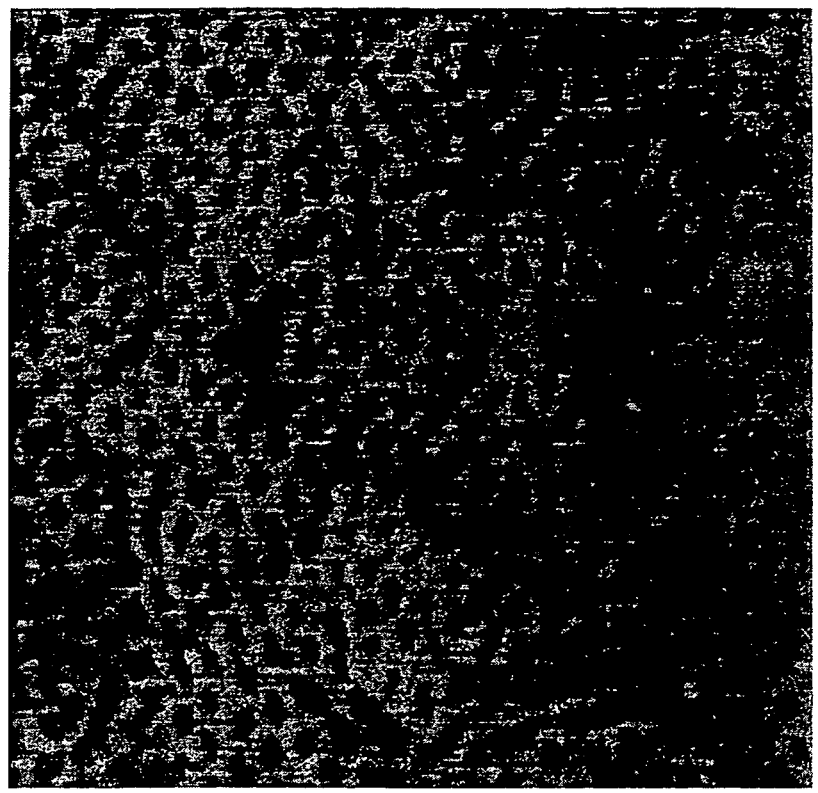
FIG. 4*b* is an AFM image of an embodiment of a step of the process according to the invention.
Figure 4C:
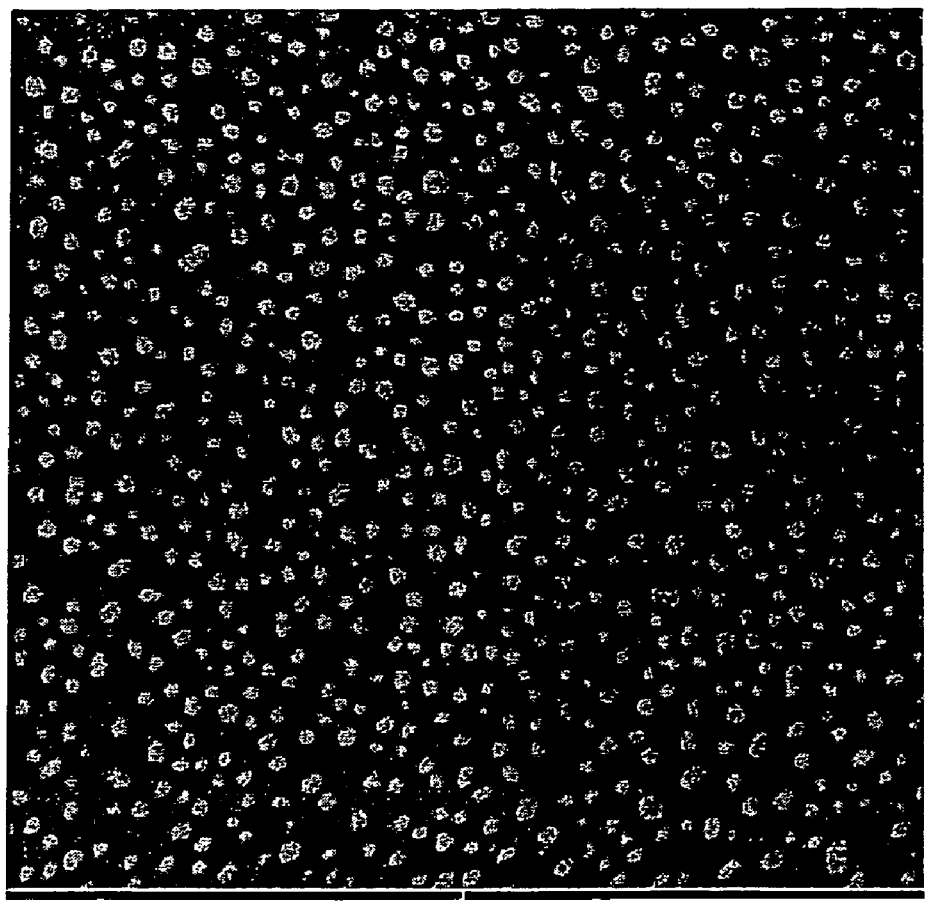
FIG. 4*c* is an AFM image of an embodiment of a step of the process according to the invention.

FIGS. 4a to 4c show AFM micrographs of the various stages of producing a self-assembled array, including the formation of the meso-scale BCP structure (4a), the selective removal of one block of the BCP (4b), and the deposition of the metal dots (4c). As shown, because the pore diameter is dependent on the size of the monomer block that is removed, the pore size can be controlled from a few nanometers up to several hundred nanometers with densities as high as $10^{11}$ $cm^{-2}$.

Figure 5A:
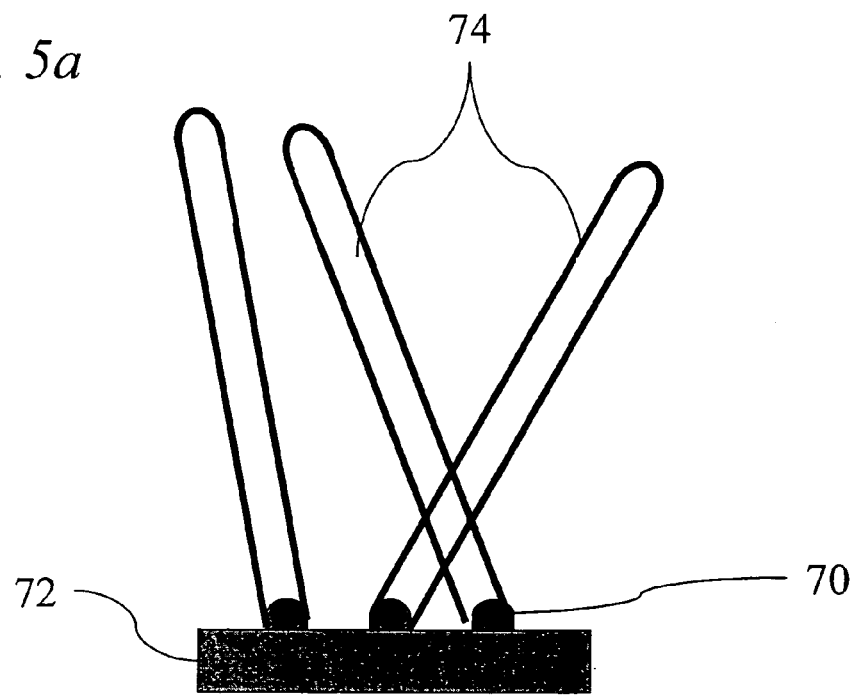
FIG. 5*a* is a schematic of one embodiment of a carbon nanotube array according to the present invention.
Figure 5B:
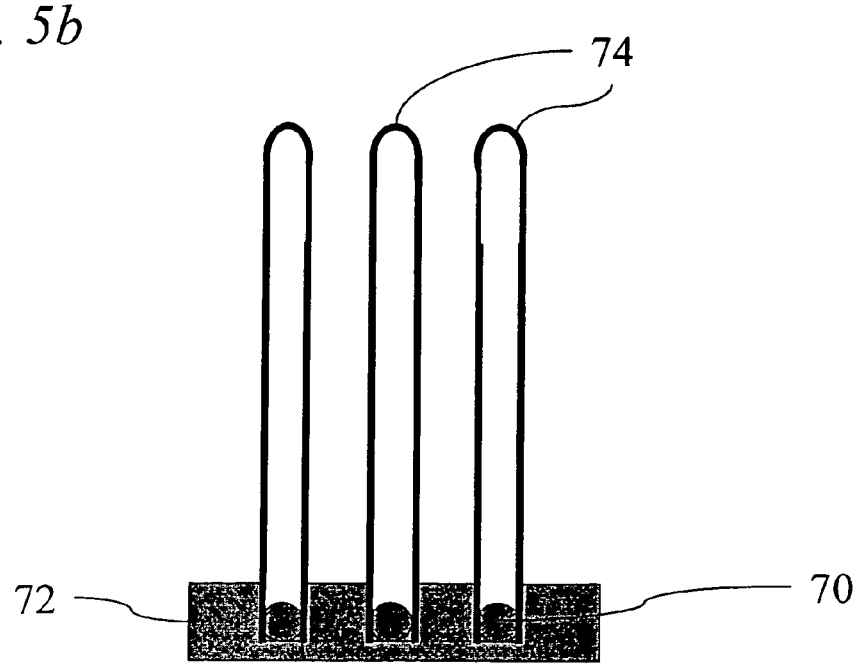
FIG. 5*b* is a schematic of a preferred embodiment of a carbon nanotube array according to the present invention.
Figure 6:
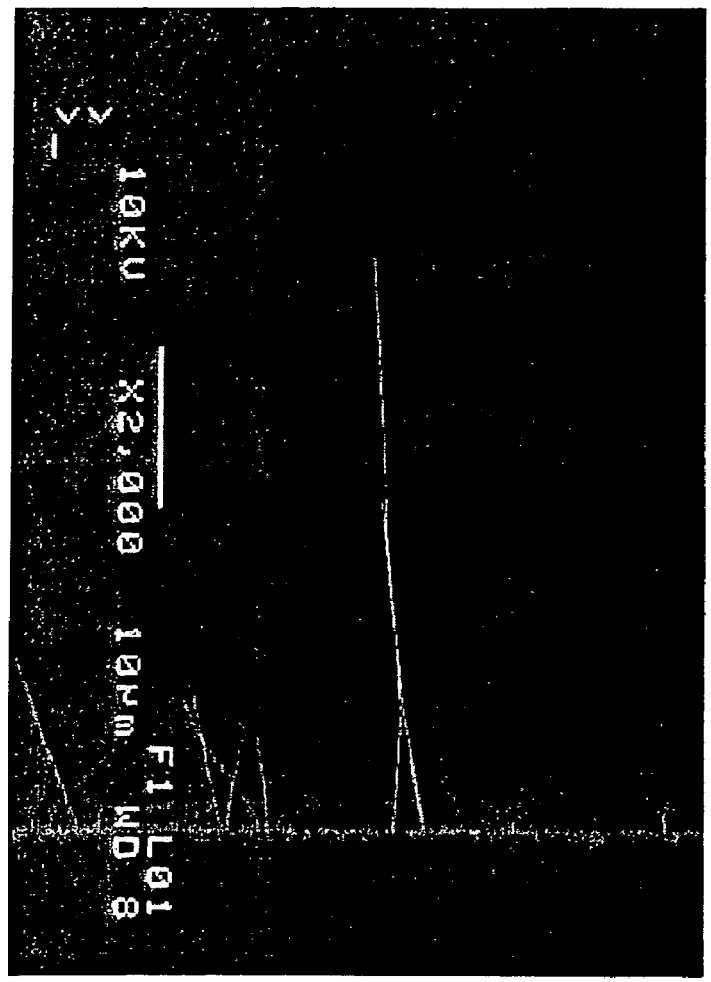
FIG. 6 is an SEM of an embodiment of a randomly oriented carbon nanotube array.

Although two exemplary methods of producing the ordered carbon nanoarrays are described above, as shown in FIG. 5a, these methods both described processes in which the catalyst nucleation points 70 are deposited on the surface of the substrate 72. As shown, under certain circumstances, despite the ordered deposition of the catalyst nucleation points 70, the lack of an orientation for the catalyst nucleation points may allow the growth of the carbon nanotubes 74 to occur in random orientations. An SEM of a carbon nanotube array produced by a conventional growth method without the benefit of an orientation guide is shown in FIG. 6. However, as shown in FIG. 5b, the growth and orientation of the carbon nanotubes 74 can be controlled by providing an initial growth direction, such as by recessing the catalyst nucleation point 70 into the surface of the substrate 72.

Figure 7:
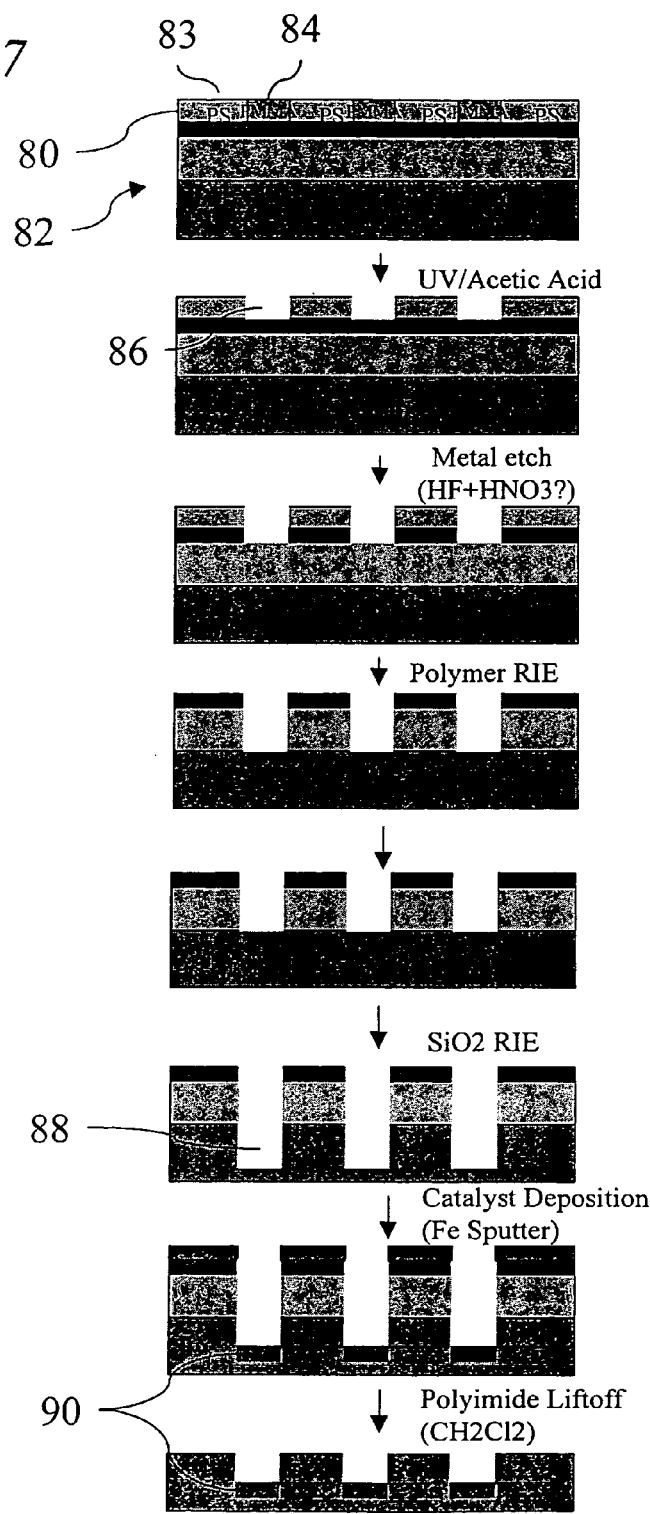
FIG. 7 is a schematic for a third embodiment of a process for forming a nano-array sieve according to the invention.

A detailed diagram of one exemplary process for providing such orientation control is shown in FIG. 7. As shown in steps 1 and 2, the process still entails the deposition and ordering of a BCP film 80 on a substrate 82 and removal of one of the two polymer components 83 and 84 to form well-ordered deposition spots 86. However, as shown in steps 2 to 6, once the substrate 82 is exposed, further etching is conducted to provide orientation recesses 88. Such etching may entail metal etching, and polymer and/or $SiO_2$ RIE. Once orientation recesses are etched in the substrate the metal catalyst 90 can be sputter or vacuum deposited onto the substrate, as shown in step 7. Finally, as shown in step 8, once the metal catalyst is deposited, the remaining polymer component 84 is removed by any conventional means leaving only the metal catalyst deposited within the orientation recesses 88.

In any of the above described embodiments, the size of the PMMA regions, and therefore the size of the ultimate carbon nanotubes depends on the size of the PS and PMMA block in the BCP molecules. Likewise, in order to form carbon nanotube arrays for a wide variety of applications, it is important to be able to control the spacing of the nanotubes on the substrate. Both of these objectives can be achieved by varying the length of the different blocks in the block copolymer starting material. Specifically, the length of the blocks determines the amount of material, and hence the size, of the features in the nano-structured polymeric material arising from each block. In general, the size of the nanotube-nucleating metal particles can be determined by controlling the length of the BCP block associated with the catalytic metal, while their separation can be controlled by varying the length of the other block. BCP's can be synthesized with a wide range of lengths of the two polymer blocks, making available a similar range of nanotube diameters and separations in the resulting nanotube arrays.

For example, in the PS/PMMA material discussed above, the diameter of the PMMA cylinders varies as the length of the PMMA block is increased or decreased, while the "size" of the PS matrix walls, i.e., the separation between the PMMA cylinders, is determined by the length of the PS block. This exemplary embodiment, as discussed above, uses a polystyrene polymethylmethacrylate block copolymer denoted P(S-b-MMA) consisting of a length, or "block", of polystyrene, typically 100 to 1000 styrene monomers in length, attached to a block of PMMA, typically 50-200 methylmethacrylate monomers long. Such a range of PS and PMMA blocks generally result in PMMA cylinders having diameters from about 10 to about 100 nm hexagonally packed in a PS matrix with a lattice spacing constant of about 10 to 100 nm. Again, as discussed above, in a recent demonstration using this system, P(S-b-MMA) composed of a PS block approximately 300 monomers long connected to a PMMA block about 100 monomers long, was found to self-assemble into arrays of PMMA cylinders having diameters of 14 nm hexagonally packed in a PS matrix with a lattice constant of 24 nm. However, P(S-b-MMA) can be easily synthesized with a wide range of lengths of the two polymer blocks, making available a similar range of nanotube diameters and separations in the resulting nanotube arrays.

For some applications it is also important to be able to control the location of limited area nanotube arrays. With the present process this can be accomplished by using photomasking to control the area of UV exposure of the block copolymer film, or by using electron beam lithography to control which regions are exposed.

The invention is also directed to a nano-array formed from one of the processes discussed above, and although in the embodiments shown in FIGS. 1 to 3, the array of nanotubes comprises periodic rows of uniform nanotubes attached to the substrate, any other arrangement of nanotubes can be utilized such as, for example, staggered arrays of uniform nano-features or uniform rows of nanotubes having alternating sizes. In another alternative embodiment the spacing of the nanotubes may also be varied.

Additionally, while FIGS. 1 to 3 only show an array deposited on a flat substrate surface, any geometry of substrate suitable could be utilized, such as, for example, a curved, corrugated or tubular substrate. It will be understood that the design of the array according to the present invention is necessarily driven by the purpose of the array, and is sensitively dependent on both the geometrical size, shape, orientation and spacing of the nanotubes as well as the size and properties of the array itself. For example, the array itself has two characteristic sizes: (1) the nano-feature size, or pore size and (2) the nano-feature spacing. Accordingly, although the self-assembled nano-array of the embodiment shown in FIGS. 1 to 3 comprise a uniform array of uniform cylindrical nanotubes, it should be understood that any shape, size, orientation, or spacing of nanotubes, as described above, can be utilized in the nano-array of the current invention such that the physical properties of the array are suitable for use in a device of interest.

Moreover, the nano-structured matrix into which the block copolymer assembles need not have the particular cylinders-in-matrix geometry described above in order to be useful. A much more common motif for such materials is for one block to form nm-size spheres, regularly arranged in a 3-dimensional crystalline array within a matrix of the other block. Such structures can also be used as templates for nano-scale patterns on substrates provided that the polymer material can be deposited in a thin enough film so that only one or a few "layers" of the spherical domains are present in the thickness of the film. Indeed, the PS/PB block copolymer referred to above is one such material, with the PB blocks forming spherical domains within the PS matrix.

In turn, while the self-assembled nano-arrays contemplated in many of the embodiments discussed in the present application are constructed of carbon nanotubes made from pyrolizing a carbon-containing feedstock over a substrate having an ordered array of germination points, the nanofeatures can be of any shape and made by any process and from any material suitable for making self-assembled nano-features, such as, for example, spheres or pyramids made of other atomic materials or even biomolecules, such as, for example, proteins. In another embodiment, the nano-features can also be further functionalized for a variety of applications, such as, for example, being made hydrophilic or hydrophobic, being charged either negatively or positively, or being derivatized with specific chemical groups, etc.

Likewise, the substrate can be made of any material which can withstand the temperatures required for growth of the nanotubes, and which can be modified to provide a suitable ordered array of germination points for growing the nanotubes of the array, such as, for example, silicon, silicon dioxide, metals, alumina, glass, or even polymeric plastics.

Any suitable catalyzing metal can be used to activate the germination points on the surface of the substrate, such as, for example, iron, nickel or cobalt. Alternatively, the catalyzing metal could be an alloy of two or more metals such as a Co/Ni alloy. The metal catalysts could also be produced by pyrolysis of inorganic or organic metal-containing compounds, such as ferric chloride, ferric nitrate or cobalt chloride. Moreover, although $FeCl_3$, is repeatedly used as an exemplary metal material, both hydrophilic and hydrophobic metal compounds abound. Examples of the former include all ionic salts of metals, such as chlorides, nitrates, etc. Examples of hydrophobic metals-containing compounds include organometallic compounds such as metal carbonyls, metallocenes and acetylacetonates (propanediones), complexes between the metal atoms and cyclopentadiene ($C_5H_6$) and 2,4-pentanedione ($CH_3COCH_2COCH_3$), respectively.

Finally, although only "carbon" containing nanotubes are discussed above, the general method may also be used to make nano-structured metal or semiconductor-containing materials. For example, in one embodiment an amphiphilic BCP consisting of blocks of polyethylene oxide (—$CH_2$—$CH_2$—O—, a hydrophilic monomer) and blocks of polypropylene oxide (—$CH_2$—$CH(CH_3)$—O—, a hydrophobic monomer) may be used to create nano-porous membranes of ceramics including $SiO_2$, $Al_2O_3$, $TiO_2$. In such an embodiment, the metal-containing precursors (chloride salts) may be co-dissolved in alcohol with the BCP such that when the solvent is evaporated, the metal ions associate primarily with the more polar ethylene oxide blocks, which form a matrix through which run cylinders of metal-free polypropylene oxide blocks. This arrangement is then preserved as the material is heated in air to oxidize away the BCP, resulting in a matrix of metal oxide through which runs a regular array of nanometer-scale pores In another embodiment, the nanofeatures may also be semiconducting nanowires, such as solid nanometer-scale wires made of silicon. These silicon nanometer-scale wires are of similar dimensions as the nanotubes and are produced very similarly. For example, in one embodiment silicon nanowires may be produced by placing the array of catalytic metal dots produced by any of the methods described herein in a reaction vessel containing a reactive silicon containing gas such as silane ($SiH_4$), rather than methane or ethylene. Although the same method may be used to produce the ordered array of catalytic metal dots, the specific catalytic materials may be different. For example, for a silicon nanowire, the catalyst is typically gold (Au), rather than iron.

Although specific embodiments are disclosed herein, it is expected that persons skilled in the art can and will design alternative methods to produce the carbon nanotube arrays that are within the scope of the following claims either literally or under the Doctrine of Equivalents.

Specifically, there are many different chemical conditions under which one block of a copolymer may exhibit differing reactivity from other blocks. Examples include acid-base chemistry, oxidation/reduction chemistry, and solvation. There also exist a large number of block copolymers known to form nano-structured matrices similar to those described herein. Thus a number of possibilities will arise for one skilled in the art for using the self assembling nano-scale structure of block copolymers as a template to create regular arrays of catalytic metal dots on substrate surfaces, and hence to grow regular arrays of nanofeatures for a wide variety of applications.

What is claimed is:

1. A method of forming an ordered array of nanofeatures comprising the steps of:
   depositing a block copolymer on a substrate, wherein the block copolymer comprises at least two different blocks, and wherein the block copolymer can self-assemble into an ordered polymeric array of a plurality of regular nanometer-scale structures;
   activating the block-copolymer to self-assemble to form the polymeric array;
   selectively removing the nanometer-scale structures made from one of the at least two different blocks from the substrate to create a plurality of voids in the polymeric array;
   applying a catalytic material such that the catalytic material bonds within the voids to form a catalytic material array, wherein the catalytic material is chosen such that an ordered catalytic material array is formed comprising a plurality of catalytic nucleation regions and having a structure defined by the polymeric array;
   removing the polymeric array from the substrate such that only the catalytic material array remains; and
   growing nanofeatures on the catalytic material array to form an ordered nanofeature array having a structure defined by the catalytic material array.

2. The method described in claim 1, wherein the step of selectively removing comprises a removal method selected from the group consisting of UV induced decomposition, solvation, reactive ion etching, acid-base reaction, and oxidation.

3. The method described in claim 1, wherein each of the at least two different blocks is made of at least one polymer monomer, and wherein the size, shape, and spacing of the nanometer-scale structures depends on the size and number of the polymer monomers in each of the at least two different blocks.

4. The method described in claim 1, wherein the size of the catalytic nucleation regions depends on the length of the block which is selectively removed to form the voids into which the catalytic material bonds.

5. The method described in claim 1, wherein spacing between the catalytic nucleation regions depends on a length of the block which is not selectively removed in the formation of the voids into which the catalytic material bonds.

6. The method described in claim 1, wherein the at least two different blocks self-assemble based on dipole interactions.

7. The method described in claim 1, wherein the block copolymer is an amphiphilic block copolymer.

8. The method described in claim 1, wherein the step of depositing comprises spin-coating a solution containing the block copolymer onto the substrate.

9. The method described in claim 1, wherein the step of activating includes annealing the polymer coated substrate.

10. The method described in claim 1, wherein the step of applying comprises a method selected from one of vapor deposition, sputter deposition, and electrochemical application.

11. The method described in claim 1, wherein the step of removing is selected from the group consisting of reactive ion etching, oxidation, and solvation.

12. The method described in claim 1, wherein the step of growing the nanofeatures further comprises heating the substrate bearing the catalytic material array under a flow of a carbon-containing gas capable of reacting on the catalytic nucleation regions to form the nanofeatures.

13. The method described in claim 12, wherein the step of heating takes place in the presence of an additional gas selected from the group consisting of argon, nitrogen, and ammonia.

14. The method described in claim 12, wherein the step of heating takes place in a vacuum chamber at sub-atmospheric pressure.

15. The method described in claim 12, wherein the substrate is heated at a temperature of about 600 to about 900° C.

16. The method described in claim 12, wherein the carbon-containing gas is selected from the group consisting of methane, ethylene, acetylene, and carbon monoxide.

17. The method described in claim 1, further comprising restricting the size of the nanofeature array by a method selected from one of photolitohography, photomasking and electron beam lithography.

18. The method described in claim 1, wherein the substrate is a complex shape selected from the group consisting of curve, corrugated and tubular.

19. The method described in claim 1, wherein the nanometer-scale structures are selected from one of cylinders and spheres.

20. The method described in claim 1, wherein the nanofeatures are a shape selected from the group consisting of tubes, spheres, pyramids and rectangles.

21. The method described in claim 1, wherein the nanofeatures are carbon nanotubes.

22. The method described in claim 21, wherein the carbon nanotubes have a uniform diameter.

23. The method described in claim 1, wherein at least two differently dimensioned nanofeatures are grown on the substrate.

24. The method described in claim 1, wherein the nanofeatures have a cross-sectional dimension of about 10 to 100 nm.

25. The method described in claim 1, wherein the nanofeature array has a lattice spacing of about 10 to 100 nm.

26. The method described in claim 1, wherein the nanofeatures are functionalized.

27. The method described in claim 1, wherein the nanofeatures are made from a material selected from the group consisting of metal oxides, silicon, or silicon dioxide.

28. The method described in claim 1, wherein the substrate is selected from the group consisting of metals, silicon dioxide, silicon, alumina, glass, and polymeric plastic.

29. The method described in claim 1, wherein the catalytic material is selected from the group consisting of Mo, W, Pd, Fe, Ni, Co and a Ni/Co alloy.

30. The method described in claim 1, wherein the catalytic material is applied as an ionic metal salt.

31. The method described in claim 30, wherein the ionic metal salt is selected from the group consisting of iron chloride, iron nitrate, nickel chloride, nickel nitrate, cobalt chloride, and cobalt nitrate.

32. The method described in claim 1, wherein the catalytic material is applied as an organometallic compound.

33. The method described in claim 32, wherein the organometallic compound is selected from the group consisting of metal carbonyls, metallocenes, and acetylacetonates.

34. The method described in claim 1, wherein the at least two different blocks are polystyrene and polymethylmethacrylate.

35. The method described in claim 34, wherein the polystyrene block has a length of about 100 to 1000 styrene monomers.

36. The method described in claim 34, wherein the polymethylmethacrylate block has a length of about 50 to 200 methylmethacrylate monomers.

37. The method described in claim 34, wherein the nanometer-scale structures comprise polymethylmethacrylate cylinders surrounded by a matrix of polystyrene.

38. The method described in claim 1, wherein the nanofeature array is a uniform periodic array having a uniform lattice spacing between nanofeatures.

39. The method described in claim 1, wherein the nanofeature array has at least two different lattice spacings.

40. The method described in claim 1, further comprising the step of etching an ordered orientation guide recess array comprising a plurality of orientation guide recesses into the substrate prior to applying the catalytic material, such that the structure of the orientation guide array is determined by the polymeric array.

41. The method described in claim 40, wherein the step of etching an ordered orientation guide recess array comprises at least one process selected from the group consisting of metal etching, reactive ion etching, and $SiO_2$ etching.

* * * * *